ARRANGEMENT AND METHOD FOR CONNECTING
ELECTRICAL CIRCUIT ELEMENTS

Filed April 28, 1955

INVENTORS
JOHN PAUL JONES
EDGAR O. SPRUDE
BY
Harris A. Mumma Jr.
ATTORNEY 2,927,251

ARRANGEMENT AND METHOD FOR CONNECTING ELECTRICAL CIRCUIT ELEMENTS

John Paul Jones, Pottstown, and Edgar O. Sprude, Philadelphia, Pa., assignors to Burroughs Corporation, Detroit, Mich., a corporation of Michigan Application April 28, 1955, Serial No. 504,556

3 Claims. (Cl. 317—101)

Figure 2:
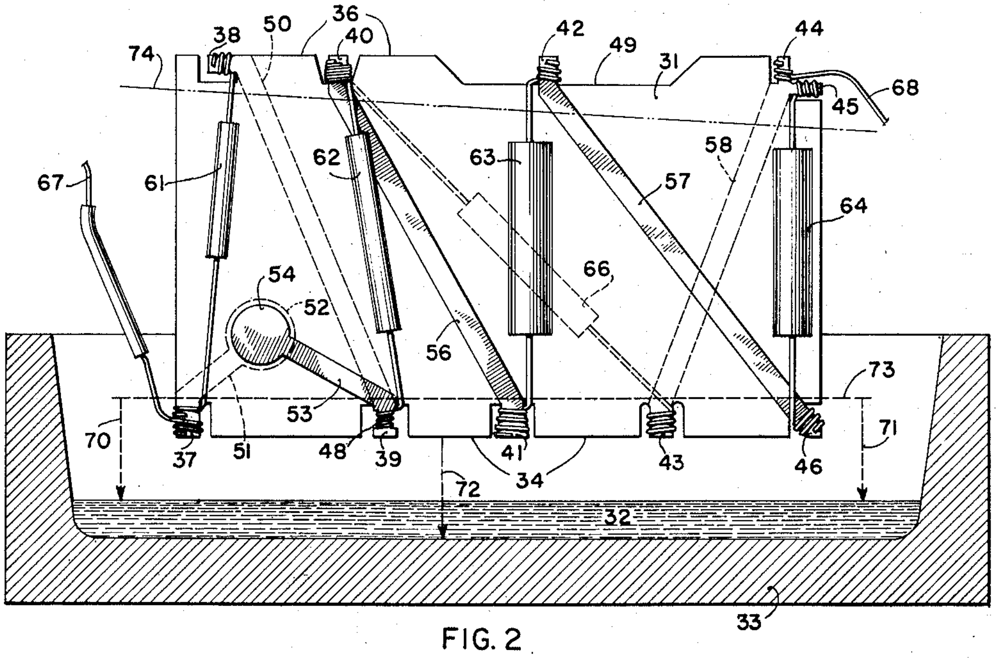

This invention relates to arrangements and methods for connecting electrical circuit elements, and more particularly for interconnecting such elements associated with a wiring card having flat conductors, adhering to its surface, for connection to the leads associated with the circuit elements.

It frequently is convenient to arrange electrical circuit elements or components, such as resistors, capacitors, small vacuum tubes, and semiconductor devices, adjacent to a card or panel of nonconductive material. The lighter components ordinarily have lead wires securely appended thereto, so that they may be affixed to the card simply by suitably anchoring the lead wires. This is accomplished conventionally by passing the lead wires through holes in the card, which may be provided with eyelets or with relatively bulky terminal brackets for facilitating conductive contact between the lead wires and the circuit conductors to which the lead wires are to be connected. These circuit conductors may be provided on the card before assembly of the circuit elements thereto and conveniently may take the form of generally flat conductors adhering to the surface or surfaces of the card. It has been found increasingly useful and expedient to employ the so-called printed or etched circuit techniques to provide such circuit conductors as required between the several points on the card to which the circuit elements are to be anchored. After the circuit elements are affixed to one side of the card, the other side may be immersed in a solder bath to provide conductive contact at the joints between the leads from the circuit elements and the printed circuit conductors.

These conventional techniques may afford adequate results, but the practice of passing the lead wires through holes tends to be time-consuming, while the provision of eyelets or metallic terminal lugs or brackets riveted to the card not only adds to the cost of the equipment, but also increases the number of separate parts which must be assembled with due care to obtain mechanical and electrical stability and continuity. The practice of dipping an entire major surface of the base card carrying the associated components in a solder bath, so as to provide soldered connections at each of the holes through which the leads are passed, also introduces difficulties, such as warping of the card and damage to the circuit components, due to the high temperatures and thermal shock associated with dipping a face of the card in a solder bath. The terminal eyelet or bracket hardware conventionally used is bulky enough to have substantial heat capacity, so that heat conduction through the lead wires during and after the solder dip may damage delicate components such as diode elements before the dipped parts cool down.

It is an object of this invention, therefore, to provide a new and improved arrangement for connecting electrical circuit elements which substantially avoids one or more of the disadvantages of the prior art arrangements.

It is another object of the invention to provide a new and improved arrangement for connecting circuit elements which makes possible the elimination of small hardware on the base card and provides a simple and inexpensive circuit structure.

It is a further object of the invention to provide a new and improved arrangement for connecting electrical circuit elements utilizing the printed circuit techniques to best advantage in association with circuit components affixed to the card on which the wiring is printed.

It is yet another object of the invention to provide a new and improved method of connecting electrical circuit elements on wiring cards which avoids one or more of the disadvantages of the prior art methods and effects such electrical connections in a reliable manner providing both mechanical strength and simplicity of structure.

In accordance with the invention, an arrangement for connecting electrical circuit elements comprises a base card of insulating material, having a plurality of lug portions of this material spaced along one edge of the card and laterally accessible from that edge, and a plurality of generally flat circuit conductors adhering along the respective flat surfaces of the conductors to at least one surface of the card and extending out individually over corresponding ones of such lug portions. The arrangement further comprises a plurality of electrical circuit elements disposed adjacent to at least one surface of the card with electrical leads for these circuit elements wrapped individually around corresponding ones of the lug portions to anchor the lead thereto, whereby the circuit conductors and the electrical leads individually adjacent to the lug portions may be interconnected conductively by applying solder to only those portions of the card within a predetermined distance from the aforesaid one edge of the card.

In accordance with another feature of the invention, the method of connecting electrical circuit elements on a wiring card comprises forming along one edge of a base card of insulating material a plurality of spaced lug portions of the material laterally accessible from that edge, affixing to at least one surface of the card a plurality of generally flat, adherent circuit conductors with the flat surfaces thereof against the surface of the card and extending these conductors individually out over the surfaces of corresponding ones of the lug portions, subsequently disposing a plurality of electrical circuit elements, provided with electrical leads, adjacent to at least one surface of the card and wrapping these electrical leads individually around corresponding ones of the lug portions to anchor the leads thereto, and subsequently immersing the card in a solder bath to a predetermined depth from the aforesaid one edge of the card, thereby causing solder to adhere to the portions of the circuit conductors and of the electrical leads so immersed and effecting conductive contact between the conductors and the leads individually adjacent to the lug portions.

For a better understanding of the present invention, together with other and further objects thereof, reference is had to the following description taken in connection with the accompanying drawing, and its scope will be pointed out in the appended claims.

Figure 1:
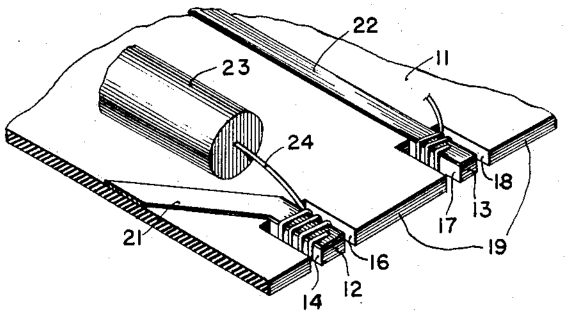
Figure 3:
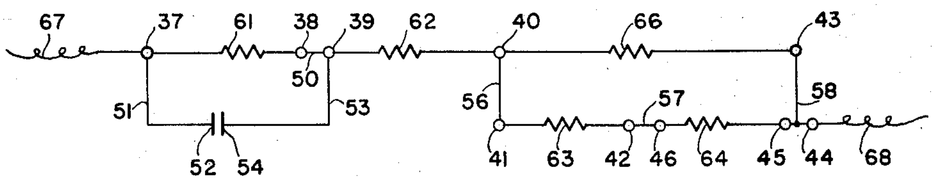

In the drawing, Fig. 1 is a perspective view of a cutaway portion of a base card or panel carrying printed circuit conductors and one of a number of electrical circuit elements in an arrangement embodying the present invention;

Fig. 2 is a view in elevation of a complete wiring card carrying circuit conductors, having circuit elements affixed to the card, and embodying various modifications of the arrangement represented in Fig. 1, this card being illustrated in Fig. 2 in association with solder bath shown in sectional elevation to illustrate a method embodying the present invention; and Fig. 3 is an elementary circuit diagram illustrating schematically the connections of the electrical circuit elements afforded by the card shown in Fig. 2.

Referring now to Fig. 1 of the drawing, there is shown in a perspective view a small portion, near one edge, of a base panel or card 11 of insulating material of a type suitable for incorporation in an arrangement for connecting electrical circuit eleemnts in accordance with the present invention. The card 11 has a plurality of lug portions 12 and 13 of the insulating material, formed by cutting rather short, narrow holes or slots 14 and 16 on each side of the tongue or lug portion 12 and similar slots 17 and 18 on each side of the lug portion 13. In this way the lug portions 12 and 13 are made laterally accessible from the one edge 19 of the card, as seen in Fig. 1, thorugh the respective slots 14, 16 and 17, 18. the two lug portions 12 and 13 are spaced from each other along the edge 19 of the card.

There is provided a plurality of generally flat circuit conductors 21 and 22, preferably of the printed circuit type, adhering along their flat surfaces to the upper surface of the card, as viewed in Fig. 1, and extending out individually over the upper surfaces of the respective lug portions 12 and 13. Also associated with the card 11 are a number of electrical circuit elements, of which only a portion of one component in the form of a tubular capacitor 23 is shown in the partial view of Fig. 1. The end of the element 23 shown in Fig. 1 is illustrated as being disposed adjacent to the upper surface of the card and as having an electrical lead 24 connected internally of the capacitor to one of the electrodes thereof, not shown. The remote end of the lead or pigtail 24 is wrapped around the lug portion 12 to anchor the lead thereto.

Referring now to Fig. 2 of the drawing, a full base card 31, complete with a plurality of adherent circuit conductors and carrying a plurality of circuit elements, is illustrated. The view of the card 31 is taken looking at one of its major faces, which for convenience may be designated its upper face, although the card is disposed either manually or by card-handling means, not shown, with its major surfaces held vertically above a shallow solder bath 32. The solder bath is retained in a container 33 which is provided with means, not shown, for maintaining the proper temperature of the bath. The card 31 is of an electrically insulating material, for example a thin laminate of cellulosic sheets impregnated with a resin, and is of rectangular over-all shape with its two longer edges 34 and 36 at the bottom and top respectively when the card is oriented as in the view of Fig. 2.

The card has a plurality of lug portions, including a lug portion 37 at its bottom left corner, a lug portion 38 near its top left corner, and lug portions 39, 40, 41, 42, and 43 spaced alternately along the bottom and top edges 34 and 36, as well as lug portions 44 and 45 at its top right corner and 46 at its bottom right corner. These lug portions have various configurations. Each of the lug portion 37—46, however, is laterally accessible from one of the edges 34 or 36 in or on which the respective lug portion is formed. Thus only a single cut is necessary to form the lug portion 37 and make it accessible laterally from the bottom edge 34 on its right side, since its left side is a part of the left edge of the card 31. The lateral parts or side edges of the lug portion 38 are parallel to the top edge 36 of the card, which forms the upper lateral part of this lug portion; the lower lateral part is accessible from the edge 36 through an L-shaped cut. The lug portion 39 has a narrowed part 48 to receive more firmly a lead wire which is wrapped around this lug portion. The lug 40 is made more readily accessible from the edge 36, since its lateral parts are exposed by wedge-shaped cuts. Such lateral exposure has been made much more pronounced for the lug 42, which in effect protrudes from a recessed section 49 of the edge 36. The lug 41 is tapered toward the central part of the card 31 by making slanting cuts into the card, thus removing any tendency of a lead wire wrapped around the lug to slip off the edge of the card. The cuts made on each side to form the lug portion 43 are rounded at the ends of the cuts. The lug portions 44 and 45 form a unit of two members, each of which is similar to the lug portion 37. Finally, the lug 46 is formed by diagonal cuts on each side of the bottom right corner of the card.

A plurality of generally thin, flat circuit conductors of the printed circuit type is provided, similarly to those in the Fig. 1 arrangement, in the form of metallic strips or stripes adhering to at least one surface, and in this case to the respective upper and lower surfaces, of the card. These conductors serve to interconnect certain ones of the lug portions as required for the circuit involved. The nature of the electrical circuit formed by the completed arrangement of the card shown in Fig. 2 has significance only as an example of an arrangement of circuit connections obtainable in accordance with the invention. In the arrangement shown, both ends of all but one of the circuit conductors terminate on respective lug portions. Thus a conductor 50 extends on the lower surface of the card 36 between the extremities of the lug portions 38 and 39. On the lower surface of the card a conductor 51 extends from the bottom end of the lug portion 37 to terminate in a circular enlargement 52. Another conductor 53 extends from the lug 39, but on the upper surface of the card; the conductor 53 terminates in a circular enlargement 54, which confronts the circular enlargement 52 across the material of the card, thus forming a capacitor 52, 54 whose dielectric is the insulating material of the card. The upper surface of the card also is provided with additional circuit conductors 56 and 57 passing respectively between the lugs 40 and 41 and between the lugs 42 and 46. On the lower surface of the card another circuit conductor 58 passes from the end of the lug portion 43 to the intersection of the two neighboring lug portions 44, 45, where it branches out to the ends of both of the latter lug portions.

The arrangement on the card 36 further includes a plurality of electrical circuit elements disposed adjacent to at least one surface of the card. Thus elements 61, 62, 63, and 64 are disposed on the upper surface of the card. These circuit elements have electrical leads wrapped individually around corresponding ones of the lug portions to anchor the leads and hence the circuit elements themselves to the lugs. For this purpose the leads from the element 61 are wrapped individually around the lug portions 37 and 38. Likewise, element 62 is inserted and fastened to the card between the lugs 39 and 40 and the element 63 is fastened between the lugs 41 and 42, while the element 64 is fastened between the lug 46 at the bottom right corner of the card and the lower lug 45 of the interconnected pair of lugs 44 and 45. Similarly disposed on the lower surface of the card is an additional circuit element 66 whose leads are wrapped individually around the lugs 40 and 43. It is noted that leads from both of the elements 62 and 66 are wrapped around the lug 40.

The lugs, of course, may serve also for external connections to the circuits, which may be made by clips or suitable plug-in contactors. If desired, wires may be fastended to the lugs for making remote external connections, and such wires 67 and 68 are shown wrapped around the lug portions 37 and 44 respectively.

In carrying out the method of connecting electrical circuit elements on a wiring card, in accordance with the present invention, a plurality of the spaced lug portions 37, 39, 41, 43, and 46 is formed along the bottom edge 34 of the insulating card 31 so as to be laterally accessible from that edge, while the lug portions 38, 40, 42, and 44, 45 are formed along the top edge 36. Any suitable cutting, sawing, stamping, grinding, or other operation may be used in forming these lug portions. The plurality of generally flat, adherent circuit conductors 50, 51, 53, 56, 57, and 58 is arranged with the respective flat surface thereof affixed to at least one surface of the card 36, in this case three to its upper surface and three to its lower surface, thus being accomplished preferably by one of the well-known etched circuit or so-called printed circuit techniques. When these conductors are applied in such a manner they are extended individually out over the surfaces of the corresponding lug portions. The lugs may be formed in the edges of the card either before or after the conductors are printed.

The printed card then is used in assembling the completed circuit by subsequently disposing the plurality of electrical circuit elements 61—64 and 66, provided with the usual electrical leads, adjacent to at least one surface of the card, in this instance to its upper surface except for the element 66. These electrical leads are wrapped individually around the selected corresponding ones of the lug portions, and this operation may be performed either manually or by automatic rotary tools operating in the laterally accessible regions around the lug portions to anchor the respective leads thereto.

The structure formed in the manner described hereinabove makes it possible to interconnect the circuit conductors and the electrical element leads individually adjacent to the lug portions by applying solder to only those portions of the card within a predetermined distance from one edge of the card. After the card assembly has been completed as far as the mechanical connections are concerned, the joints are soldered where the printed circuit wiring and the leads from the components come together. Instead of using a soldering iron at each joint or immersing an entire surface of the card, it is possible, with the arrangement described, to immerse only the portions of the card near the edges 34 and 36. The card is shown in Fig. 2 ready to have its edge portion 34 so treated by lowering the card, as indicated by the dashed arrows 70, 71, and 72.

Thus the card subsequently is immersed in the solder bath 32 to a predetermined depth from the one edge 34; this is the depth attained when the edge 34 strikes the bottom of the container 33, bringing the solder to the level indicated by the dashed line 73. This immersion causes the solder to adhere to the portions so immersed of the circuit conductors 50, 51, 53, 56, 57, and 58 and of the electrical leads extending from the bottom ends of the circuit elements 61—64 and 66, thereby the solder effects conductive contact between the conductors and the leads individually adjacent to each of the lug portions 37, 39, 41, 43 and 46. Thus the lead from the element 61, the external lead 67, and the lower end of the conductor 51 are firmly affixed mechanically to the lug 37 and conductively connected electrically by means of the solder which adheres to the bottom end of the conductor 51 on the lower surface of the lug 37 and to the aforementioned leads wrapped around the lug adjacent to the lower surface of the lug. The other connections are made at the other lugs in a similar manner, and the card may then be removed, turned around, and immersed again from the opposite edge so that the conductive portions near its edge 36 are covered with solder to the depth indicated by the dashed line 74. In this way the solder, which adheres to the portions of the circuit conductors and of the electrical leads which lie adjacent to the lugs and within a predetermined distance from the respective edge of the card, interconnects conductively the circuit conductors and the electrical leads individually adjacent to each of the lug portions. For simplicity of illustration no attempt has been made to show the solder on the conductors in the drawing.

It is noted particularly that the arrangement and method of the invention make it very easy to transfer circuit connections between the upper and lower surfaces of the wiring card and permit the mounting of circuit elements on both of these surfaces while still permitting soldering of the joints by immersion in a bath. Referring, for example, to the lug portion 39, the conductors 50 and 53 on opposite surfaces of the card are connected to each other and to the element 62 at this lug. At the lug 40 the elements 62 and 66 are connected to each other, though on opposite surfaces, as well as to the conductor 56.

While the arrangement of the circuit connections is not part of the present invention, the schematic diagram of Fig. 3 represents the circuit connections obtained as described hereinabove. The circuit may be thought of as a network terminating with the external lead wires 67 and 68 and having a number of intermediate terminal points corresponding to the lug portions 37—46. The opposed circular portions 52 and 54 of the conductors 51 and 53 form a capacitor connected in parallel across the element 61 between the lugs 37 and 39. The positions of the other circuit elements 62, 63, 64, and 66 also may be found in Fig. 3.

It will be evident that the present invention provides an economical arrangement and method for connecting electrical circuit elements both mechanically and electrically. Many modifications of the specific structures described hereinabove and shown in the drawing will occur to those acquainted with the electrical and mechanical design of electrical circuit assemblies. The forms of the lug portions and the circuit conductors may be varied, of course, to satisfy the special requirements imposed by the material and circuit elements desired to be used, the arrangement of the conductors printed or otherwise provided on the base card, and the manipulative techniques used during the assembly operations. For example, the wiring card may be round instead of rectangular with the lug portions spaced around the periphery of the card. In such a case the edge regions of the card may be immersed in solder by rolling the edge of the vertically disposed card through a shallow solder bath.

Accordingly, while there have been described what at present are considered to be the preferred embodiments of this invention, it will be obvious to those skilled in the art that various changes and modifications may be made therein without departing from the invention. It is aimed, therefore, in the appended claims to cover all such changes and modifications as fall within the true spirit and scope of the invention.

What is claimed is:

1. An arrangement for connecting electrical circuit elements, comprising: a base card of insulating material having a plurality of lug portions of said material spaced along one edge of said card and laterally accessible from said edge; a plurality of generally flat circuit conductors adhering along respective flat surfaces thereof to at least one surface of said card and extending out individually over corresponding ones of said lug portions; and a plurality of electrical circuit elements disposed adjacent to at least one surface of said card with electrical leads for said circuit elements wrapped individually around corresponding ones of said lug portions to anchor said leads thereto, whereby said circuit conductors and said electrical leads individually adjacent to said lug portions may be interconnected conductively by applying solder to only those portions of said card within a predetermined distance from said one edge of said card.

2. An arrangement for connecting electrical circuit elements, comprising: a base card of insulating material having a plurality of lug portions of said material spaced along one edge of said card and laterally accessible from said edge; a plurality of generally flat circuit conductors adhering along respective flat surfaces thereof to at least one surface of said card and extending out individually over corresponding ones of said lug portions; a plurality of electrical circuit elements disposed adjacent to at least one surface of said card with electrical leads for said circuit elements wrapped individually around corresponding ones of said lug portions to anchor said leads thereto; and solder, adhering to the portions of said circuit conductor and of said electrical leads which lie adjacent to said lug portions and within a predetermined distance from said one edge of said card, interconnecting conductively said circuit conductors and said electrical leads individually adjacent to said lug portions.

3. The method of connecting electrical circuit elements on a wiring card, comprising: forming along one edge of a base card of insulating material a plurality of spaced lug portions of said material laterally accessible from said edge; arranging a plurality of generally flat circuit conductors with the respective flat surfaces thereof affixed to at least one surface of said card and with said conductors extending individually out over the surfaces of corresponding ones of said lug portions; subsequently disposing a plurality of electrical circuit elements, provided with electrical leads, adjacent to at least one surface of said card and wrapping said electrical leads individually around corresponding ones of said lug portions to anchor said leads thereto; and subsequently immersing said card in a solder bath to a predetermined depth from said one edge, thereby causing solder to adhere to the portions of said circuit conductors and of said electrical leads so immersed and effecting conductive contact between said conductors and said leads individually adjacent to said lug portions.

References Cited in the file of this patent

UNITED STATES PATENTS

| | | |
|---|---|---|
| 1,767,715 | Stoekle | June 24, 1930 |
| 1,938,410 | Van Billiard | Dec. 5, 1933 |
| 2,244,009 | Hiensch | June 3, 1941 |
| 2,533,483 | Losquadro | Dec. 12, 1950 |
| 2,602,731 | Nierenberg | July 8, 1952 |
| 2,626,973 | Dutra | Jan. 27, 1953 |
| 2,671,264 | Pessel | Mar. 9, 1954 |
| 2,707,272 | Blitz | Apr. 26, 1955 |

FOREIGN PATENTS

| | | |
|---|---|---|
| 202,760 | Great Britain | Aug. 30, 1923 |
| 816,686 | France | Aug. 13, 1937 |